(12) United States Patent
Buttet et al.

(10) Patent No.: US 7,867,788 B2
(45) Date of Patent: Jan. 11, 2011

(54) SPIN-DEPENDENT TUNNELLING CELL AND METHOD OF FORMATION THEREOF

(75) Inventors: De Come Buttet, Grenoble (FR); Michel Hehn, Maisons Neuves (FR); Stephane Zoll, Froges (FR)

(73) Assignees: Freescale Semiconductor, Inc., Austin, TX (US); Centre National de la Recherché Scientifique (CNRS), Paris (FR); STMicroelectronics (Crolles 2) SAS, Crolles (FR)

( * ) Notice: Subject to any disclaimer, the term of this patent is extended or adjusted under 35 U.S.C. 154(b) by 334 days.

(21) Appl. No.: 12/067,585

(22) PCT Filed: Sep. 20, 2005

(86) PCT No.: PCT/EP2005/011642

§ 371 (c)(1),
(2), (4) Date: Mar. 20, 2008

(87) PCT Pub. No.: WO2007/038971

PCT Pub. Date: Apr. 12, 2007

(65) Prior Publication Data

US 2009/0243007 A1 Oct. 1, 2009

(51) Int. Cl.
*H01L 21/00* (2006.01)
(52) U.S. Cl. .................. 438/3; 438/240; 257/295; 257/298; 257/326; 257/E21.663; 257/E27.005; 257/E43.004; 257/E43.006
(58) Field of Classification Search .......... 438/3, 438/52, 99, 240; 257/E27.005, 103, E43.003, 257/295–298, 326, 21.663, E43.006
See application file for complete search history.

(56) References Cited

U.S. PATENT DOCUMENTS

| 6,069,820 | A  | * | 5/2000  | Inomata et al. | 365/171   |
|-----------|----|---|---------|----------------|-----------|
| 6,108,177 | A  | * | 8/2000  | Gill           | 360/324.12|
| 6,178,074 | B1 | * | 1/2001  | Gill           | 360/324.2 |
| 6,181,537 | B1 | * | 1/2001  | Gill           | 360/324.2 |
| 6,347,049 | B1 | * | 2/2002  | Childress et al.| 365/173  |
| 6,437,949 | B1 | * | 8/2002  | Macken et al.  | 360/319   |
| 6,473,337 | B1 | * | 10/2002 | Tran et al.    | 365/173   |
| 6,639,291 | B1 | * | 10/2003 | Sin et al.     | 257/427   |
| 6,777,731 | B2 | * | 8/2004  | Kreupl         | 257/295   |
| 6,807,031 | B2 | * | 10/2004 | Macken et al.  | 360/317   |
| 7,345,855 | B2 | * | 3/2008  | Parkin         | 360/324.2 |
| 7,349,187 | B2 | * | 3/2008  | Parkin         | 360/324.2 |
| 7,379,280 | B2 | * | 5/2008  | Fukumoto et al.| 360/324.2 |
| 7,390,584 | B2 | * | 6/2008  | Daughton et al.| 428/811.2 |
| 7,488,609 | B1 | * | 2/2009  | Lin et al.     | 438/3     |
| 7,576,956 | B2 | * | 8/2009  | Huai           | 360/324.2 |

(Continued)

OTHER PUBLICATIONS

L. Le Brizoual et al, "Magnetic tunnel junctions with a zinc oxide-cobalt oxide composite tunnel barrier", Applied Physics Letters 86, 112505-1 112505-3, (2005).*

(Continued)

*Primary Examiner*—Michael S Lebentritt

(57) ABSTRACT

A Spin-Dependent Tunnelling cell comprises a first barrier layer of a first material and a second barrier layer of a second material sandwiched between a first ferromagnetic layer and a second ferromagnetic layer. The first and second barrier layers are formed to a combined thicknesses so that a Tunnelling Magnetoresistance versus voltage characteristic of the cell has a maximum at a non-zero bias voltage.

20 Claims, 3 Drawing Sheets

U.S. PATENT DOCUMENTS

| | | | |
|---|---|---|---|
| 7,595,967 B1 * | 9/2009 | Moon et al. | 360/324.2 |
| 2003/0142562 A1 * | 7/2003 | Kreupl | 365/200 |
| 2008/0209714 A1 * | 9/2008 | Zhao et al. | 29/603.14 |

OTHER PUBLICATIONS

Sharma et al; "Inversion of Spin-Polarization and Tunneling Magnetoresistance in Spin-Dependent Tunneling Junctions", Phys. Rev. Lett., vol. 82 No. 3, 616-619, (1999).

Gabillet et al "Spin-dependent tunneling in magnetic tunnel junctions with Al2O3, MgO, NiO and hybrid structures", Journal of Magnetism and Magnetic Materials, vol. 272-276, May 2004.

Sharma et al; "Inversion of Spin Polarization and Tunneling Magnetoresistance in Spin-Dependent Tunneling Junction"; Phys. Rev. Letters USA, vol. 82, pp. 616-619, 1999.

* cited by examiner

US 7,867,788 B2

SPIN-DEPENDENT TUNNELLING CELL AND METHOD OF FORMATION THEREOF

FIELD OF THE INVENTION

This invention relates to a method of forming a spin-dependent tunnelling cell of the type, for example, comprising a first barrier layer and a second barrier layer sandwiched between a first layer of ferromagnetic material and a second layer of ferromagnetic material. This invention also relates to a spin-dependent tunnelling cell of the type, for example, comprising a first barrier layer and a second barrier layer sandwiched between a first layer of ferromagnetic material and a second layer of ferromagnetic material.

BACKGROUND OF THE INVENTION

In the field of memory devices, a variety of memory technologies exist to serve as volatile and non volatile memories. One particular memory technology, known as Magnetic Random Access Memory (MRAM), is currently being developed and posses faster access times than some of the existing non volatile memory technologies.

An MRAM device typically comprises a matrix of MRAM cells, each cell comprising a Magnetic Tunnel Junction (MTJ) having a barrier layer of insulating material disposed between a first ferromagnetic layer and a second ferromagnetic layer. MRAM cells make use of so-called spin transport phenomena, in particular the tunnelling of electrons from the first ferromagnetic layer to the second ferromagnetic layer. In this respect, relative magnetic polarisations between the first and second ferromagnetic layers dictate the quantity of electrons that tunnel between the first and second ferromagnetic layers.

The above tunnelling currents, due the relative magnetisations of the first and second ferromagnetic layers, are characterised by a parameter known as "Tunnel MagnetoResistance" (TMR). For example, when the magnetization of the first ferromagnetic layer is in parallel with the magnetization of the second ferromagnetic layer, the resistance associated with such a parallel configuration is lower than a resistance associated with the magnetization between the first and second ferromagnetic layers being anti-parallel with respect to each other. The TMR quantifies the difference between the two resistance respectively associated with the above two states.

Consequently, a data bit can be stored in a given MRAM cell and retrieved therefrom by applying a potential difference across the given MRAM cell and making a comparison between the resulting current and a current known from a reference MRAM cell, the comparison of resistances corresponding to a comparison of resistances.

In practice, it is desirable to obtain as high a TMR value as possible when operating an MRAM cell in order to be able to use as large a difference of resistance between the two states as possible and hence improve performance of the MRAM cell, in particular access time.

An attempt to achieve maximum TMR is disclosed in "Spin-dependent tunnelling in magnetic tunnel junctions with $Al_2O_3$, MgO, NiO and hybrid structures" (L. Gabillet, B. Diouf, J. F. Bobo, D. Serrate, J. M. de Teresa, JMMM, Vol. 272-276, p. E1525-26, May 2004). This document relates, inter alia, to hybrid barriers formed from three sub-nanometric layers, but simply discloses that the thickness of the hybrid barrier impacts upon the quantum of the TMR.

Further, "Magnetic tunnel junctions with a zinc oxide—cobalt oxide composite tunnel barrier" (L. Le Brizoual, M. Hehn, E. Snoeck, F. Montaigne, M. Alnot, A. Schuhl, P. Alnot, (Applied Physics Letters 86, 112505 (2005)) discloses use of a Spin Dependent Tunnelling (SDT) cell as a rectifying diode. Instead of a single barrier layer, the SDT cell also comprises a hybrid barrier, but formed from two different layers of insulating materials. According to the authors of this cited document, the use of the hybrid barrier layers results in the SDT cell having an asymmetric potential barrier profile, as well as an asymmetric current vs. voltage characteristic and an asymmetric and shifted TMR vs. voltage characteristic.

Additionally, MRAM cells require a voltage bias to operate in order to maximise current variations and hence performance. However, in relation to the two cell structures described above, maximum TMR is typically obtained at zero bias voltage and then decreases when applied voltage increases or decreases. Hence, insufficient coincidence exists between a bias voltage required for operation of the MRAM cell and a maximum of the TMR characteristic of the MRAM cell and so optimum performance of the MRAM cell is not achieved.

STATEMENT OF INVENTION

According to the present invention, there is provided a method of forming a spin-dependent tunnelling cell and a spin-dependent tunnelling cell as set forth in the appended claims.

BRIEF DESCRIPTION OF THE DRAWINGS

At least one embodiment of the invention will now be described, by way of example only, with reference to the accompanying drawings, in which.

DESCRIPTION OF PREFERRED EMBODIMENTS

Figure 1:
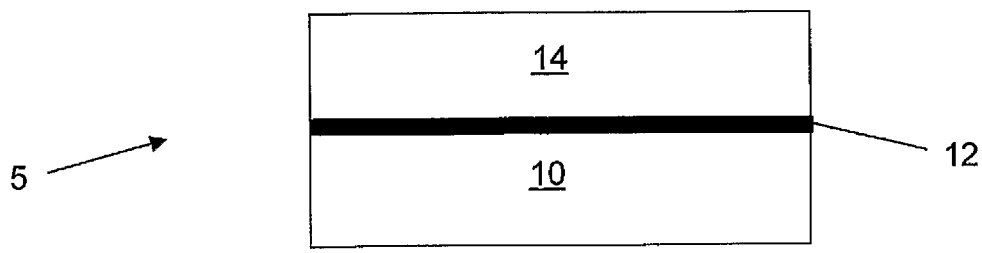
FIG. 1 is a schematic diagram of a first stage of formation of a spin-dependent tunnelling cell constituting an embodiment of the invention.

Throughout the following description identical reference numerals will be used to identify like parts.

Referring to FIG. 1, a Spin-Dependent Tunnelling (SDT) cell 5, sometimes referred to as a Magnetic Tunnel Junction (MTJ) device, is formed upon an interconnect layer (not shown) of a matrix of semiconductor switching devices, such as Field Effect Transistors (FETs). Metallic wires (also not shown) formed as part of the interconnect layer have a layer of dielectric material 10 formed thereon, a metallic buffer layer 12 being formed adjacent the layer of dielectric material 10 by sputtering of a metal, for example, Tantalum over the layer of dielectric material 10.

A first layer of ferromagnetic material 14, for example Cobalt (Co), is then formed upon the metallic buffer layer 12 by a Physical Vapour Deposition (PVD) process. Typically, the PVD process has an operating pressure of between about $10^{-2}$ and about $10^{-4}$ mBar, a substrate (not shown) of the SDT cell 5 being maintained at a temperature of between about −40° C. and about 300° C. In this example, Argon is employed as a sputtering gas. The first layer of ferromagnetic material 14 is deposited to a thickness of between a few nanometers to about 1000 nanometers.

Alternatively, a Molecular Beam Epitaxy (MBE), Pulsed Laser Deposition (PLD), or Ion Beam Deposition (IBD) processes can be employed. The first layer of ferromagnetic material 14 serves, in operation, as a reference layer.

Figure 2:
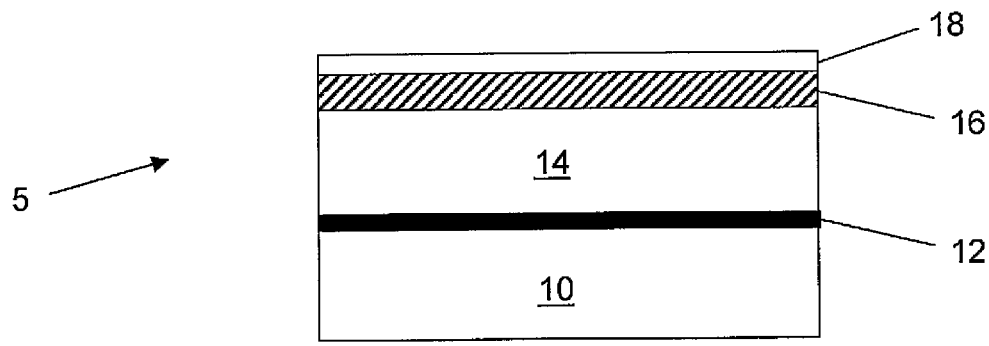
FIG. 2 is a schematic diagram of a second stage of formation of the spin-dependent tunnelling cell of FIG. 1.

Thereafter (FIG. 2), a first barrier layer 16 of a first insulating material, for example a non-stoechiometric oxide of aluminium ($Al_xO_y$), such as $Al_2O_3$, is deposited to a first thickness, $t_1$, on the first layer of the first ferromagnetic material 14 using, again, the PVD process. As in relation to the first layer of the first ferromagnetic material 14, the MBE, PLD or the IBD processes can be employed in place of the PVD process.

In the present example, aluminium is deposited as the first barrier layer 16 using the PVD process and the deposited aluminium is then oxidised by exposure of the first barrier layer 16 to an oxygen DC plasma.

A second barrier layer 18 of a second insulating material, for example Magnesium Oxide (MgO), is then deposited to a second thickness, $t_2$, upon the first barrier layer 16 by the PVD process, although the MBE, PLD or IBD processes can be used in the alternative. Again, Magnesium can be deposited upon the first barrier layer 16 using the PVD process and the deposited Magnesium is then oxidised by exposure of the second barrier layer 18 to an oxygen DC plasma. Typically, the sputtering process for both the aluminium and the magnesium layers has an operating pressure of between about $10^{-2}$ and about $10^{-4}$ mBar, the substrate (not shown) of the SDT cell 5 again being maintained at a temperature of between about −40° C. and about 300° C. In this example, Argon is also employed as the sputtering gas. In relation to exposure of each of the aluminium and magnesium layers to the oxygen DC plasma, the oxygen ($O_2$) is provided at room temperature 25° C. and at a pressure of $10^{-1}$ mBar.

It should be understood that alternative deposition techniques for the first and second barrier layers 16, 18 can be employed. For example, the aluminium and the magnesium are deposited and then oxidised together, again using the oxygen DC plasma. Alternatively, multiple deposition-oxidation steps can be employed per barrier layer. For example, aluminium can be sputtered to form half of the first barrier layer 16, the deposited aluminium then being oxidised. Thereafter, a second half of the first barrier layer 16 is formed by further sputtering of the aluminium, followed by oxidation of the second half of the first barrier layer 16. This multiple stage barrier layer deposition technique is repeated using magnesium to form the second barrier layer 18. Using this exemplary technique, homogeneous barrier layers are achieved. As a further alternative, the aluminium oxide and/or magnesium oxide can be deposited by sputtering from a metallic oxide target, for example a Magnesium Oxide target or an Aluminium Oxide target, thereby avoiding a need for one or more oxygen DC plasma stages. Of course, the skilled person will appreciate that a number of oxidation techniques exist that can be used in addition to or in place of the DC oxidation technique, for example techniques that expose deposited metals to an oxidising atmosphere, such as natural and/or so-called "radical shower" oxidation techniques.

Figure 3:
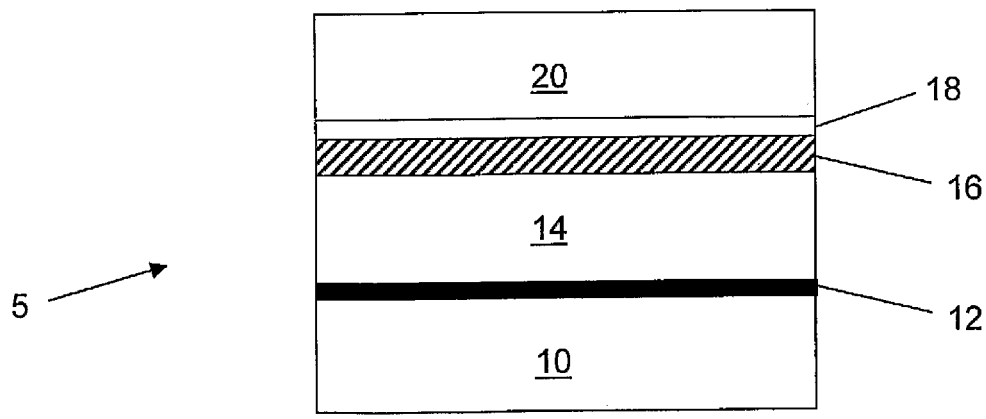
FIG. 3 is a schematic diagram of a third stage of formation of the spin-dependent tunnelling cell of FIGS. 1 and 2.

Turning to FIG. 3, a second layer of ferromagnetic material 20, for example also Cobalt, is then deposited upon the second barrier layer 18 using the PVD process. Again, the PVD process typically has an operating pressure of between about $10^{-2}$ and about $10^{-4}$ mBar, the substrate (not shown) of the SDT cell 5 being again maintained at a temperature of between about −40° C. and about 300° C. In this example, Argon is also employed as a sputtering gas. The second layer of ferromagnetic material 20 is deposited to a thickness of between a few nanometers to about 1000 nanometers.

Yet again, the skilled person will appreciate that the MBE, PLD or IBD processes can be used as an alternative to the PVD process. The second layer of ferromagnetic material 20 serves, in operation, as a so-called "soft" or "free" layer.

Figure 4:
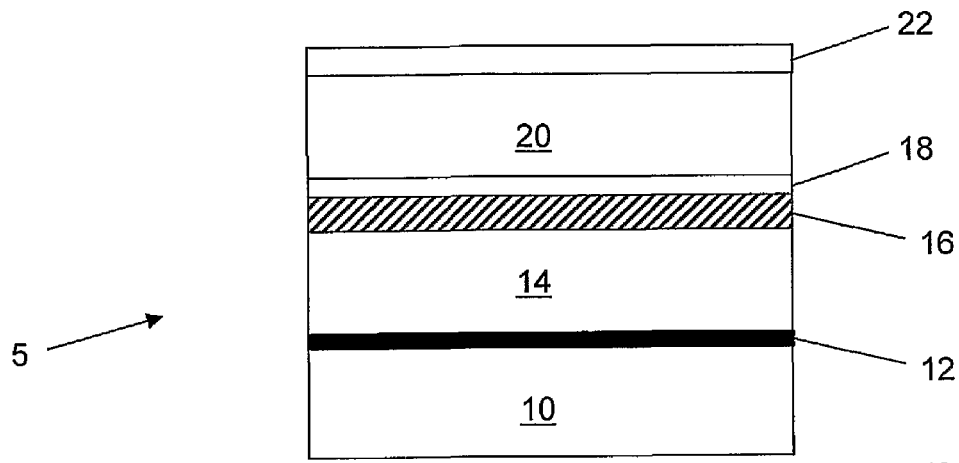
FIG. 4 is a schematic diagram of a fourth stage of formation of the spin-dependent tunnelling cell of FIGS. 1, 2 and 3.

Finally (FIG. 4), a contact layer 22 is deposited upon the second layer of the second ferromagnetic material 20 as part of a known metallization process for patterning contacts upon SDT cells.

In this example, the above-described SDT cell is a Magnetic Random Access Memory (MRAM) cell and a repeating pattern of MRAM cells are disposed as a matrix of MRAM cells with other known drive circuitry coupled respectively to the matrix of MRAM cells to provide read and write functionality. The thus formed matrix of MRAM cells constitutes an MRAM device.

Figure 5:
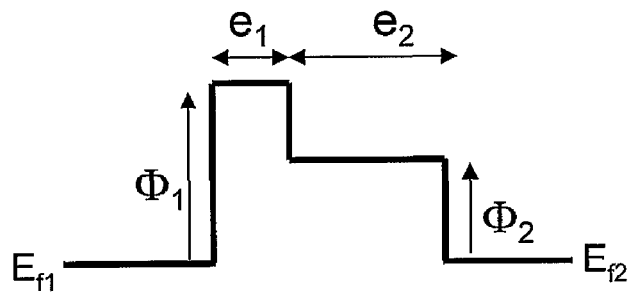
FIG. 5 is a schematic diagram of a band structure of the spin-dependent tunnelling cell of the embodiment of the invention.

Referring to FIG. 5, in operation, the SDT cell formed as described above possesses an asymmetric potential profile. In this example, the first ferromagnetic layer 14 is grounded, i.e. at a potential of 0 Volts, and a bias voltage is applied to the second ferromagnetic layer 20. Consequently, when a positive potential difference (the bias voltage) is applied across the first and second ferromagnetic layers 14, 20, electrons tunnel through the first and second barrier layers 16, 18, from a first Fermi level, $E_{f1}$, of the first ferromagnetic layer 14 to a second Fermi level, $E_{f2}$, of the second ferromagnetic layer 20. When a negative potential difference is applied across the first and second ferromagnetic layers 14, 20, electrons tunnel through the second and first barrier layers 18, 16, from the second Fermi level, $E_{f2}$, of the second ferromagnetic layer 20 to the first Fermi level, $E_{f1}$, of the first ferromagnetic layer 14.

Figure 6:
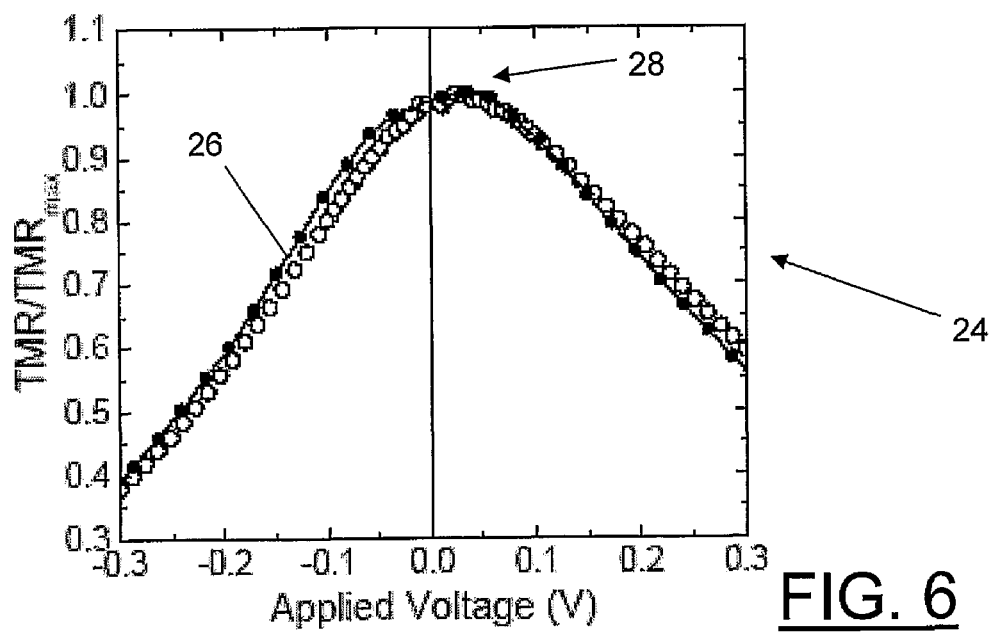
FIG. 6 is a graph of a Tunnelling Magnetoresistance vs. voltage characteristic of the spin-dependent tunnelling cell of FIGS. 1 to 4.

A Tunnelling MagnetoResistance (TMR) versus voltage characteristic 24 (FIG. 6) plotted using experimental measurements shows a TMR characteristic curve 26 having a maximum 28 that is not centred about a potential of zero volts, i.e. the maximum 28 corresponds to a non-zero potential and so the characteristic curve 26 is asymmetric about 0 volts.

The voltage at which the location of the maximum 28 of the TMR characteristic curve 26 occurs can be translated by varying a combined thickness of the first and second barrier layers 16, 18, i.e. the sum of the first thickness, $t_1$, and the second thickness, $t_2$.

In this example, the combined thickness ($t_1+t_2$) of the first and second barrier layers 16, 18 is between about 0.6 nm and about 2.1 nm, and as a composition ($t_1/t_1+t_2$), between about 0.1 and 0.9. The composition reflects the relative thicknesses between the first and second barrier layers 16, 18. For example, if $t_1/t_1+t_2=0.6$, this means that the thickness of the first barrier layer ($t_1$) represents 60% of the total thickness ($t_1+t_2$) and so the thickness of the second barrier layer ($t_2$) is 40% of the total thickness.

Figure 7:
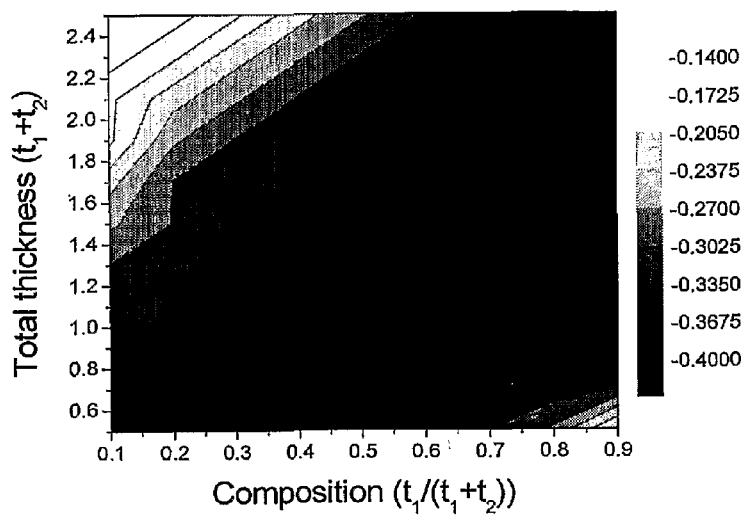
FIGS. 7 to 9 are plots of potentials, at which Tunnelling Magnetoresistance are maximum, with combined thickness of barrier layers of the spin-dependent tunnelling cell of FIGS. 1 to 4.
Figure 8:
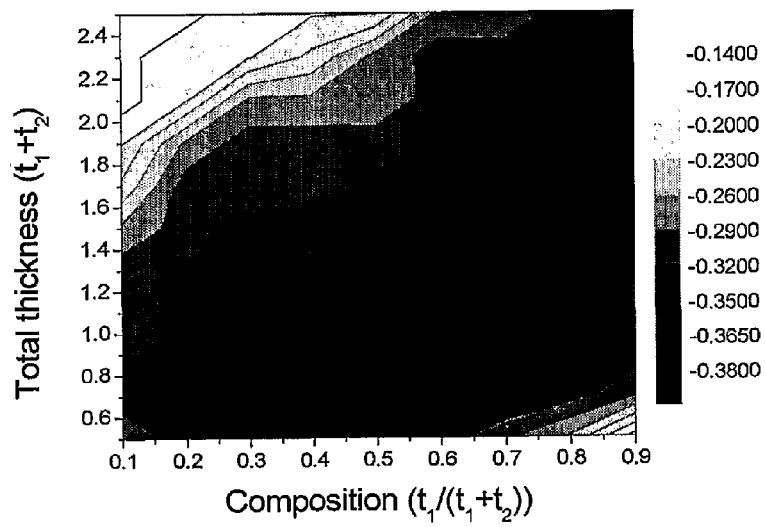
Figure 9:
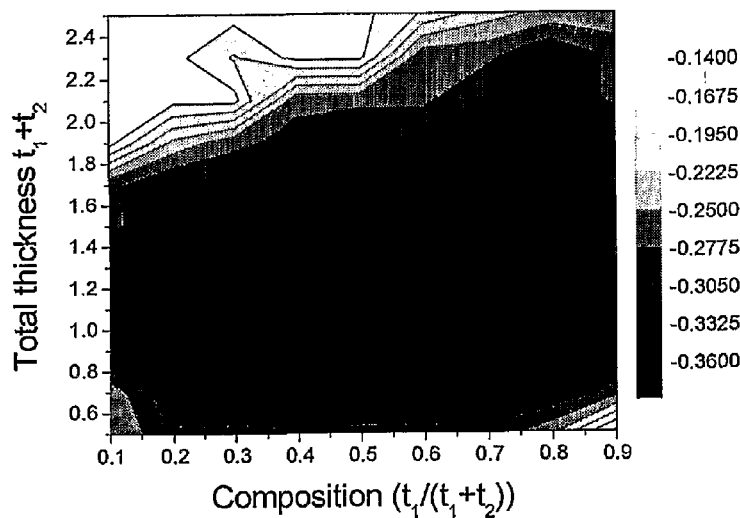

Referring to FIG. 7, where a first quantum barrier, $\Phi_1$, of 2.5 eV is provided by the first barrier layer 16 and a second quantum barrier, $\Phi_2$, of 0.4 eV is provided by the second barrier layer 18. The first and second quantum barriers $\Phi_1$, $\Phi_2$ are material-intrinsic and known from existing single tunnel junctions. For example, a quantum barrier of 2.5 eV is commonly found for the AlO, and barriers of 0.4, 0.7, 1 eV are known for MgO, the TMR maximum shifts in response to different combined thicknesses of the first and second barrier layers 16, 18. FIGS. 8 and 9 correspond to the first quantum barrier, $\Phi_1$, being 2.5 eV and the second quantum barrier, $\Phi_2$, being 0.7 eV, and first quantum barrier, $\Phi_1$, being 2.5 eV and the second quantum barrier, $\Phi_2$, being 1 eV, respectively. The above examples show that a shift of up to a few hundred millivolts, for example from about 300 to about 400 mV, can be achieved.

Particular control of the voltage at which the maximum 28 of the TMR characteristic curve 26 is located is achieved by varying the barrier height difference between the first and second quantum barriers, i.e. varying $\Phi_1$-$\Phi_2$, thereby changing the electrical properties of the materials used to form the first and/or second barrier layers 16, 18. As high an absolute value as possible of the difference between the quantum barrier heights, within physical limitations of the materials forming the first and second barrier layers 16, 18, is desirable. In this example, the absolute value of the difference between the quantum barrier heights is between about 0 eV and about 10 eV.

Although the above examples have been described in the context of the SDT cell being used for MRAM applications, the skilled person will appreciate that other applications for the SDT cells exist, for example, read heads or sensors.

Whilst the above examples have been described in relation to the first and second barrier layers 16, 18 being formed from aluminium oxide and magnesium oxide, the skilled person will appreciate that other combinations of insulting materials can be employed, for example BN, $Zr_{1-x}O_x$, $Hf_{1-x}O_x$, AlN, $Ta_{1-x}O_x$, ZnS, ZnSe.

In the above examples, the first and second ferromagnetic layers 14, 20 are formed from cobalt. However, the skilled person will appreciate that different materials can be employed, for example $Ni_{1-x}Fe_x$, $Co_{1-x}Fe$, or $Co_xFe_yB_z$. Further, the first and second ferromagnetic layers need not be formed from the same material and different combinations of ferromagnetic materials, including magnetic semiconductors, can be employed, for example, $Ni_{1-x}Fe_x/Co_xFe_yB_z$, $Ni_{1-x}Fe_x/Co_{1-x}Fe$, or $Co_xFe_yB_z/Co_{1-x}Fe$.

Although in the above examples, a hybrid barrier has been described comprising only two barrier layers, the skilled person will appreciate that more than two barrier layers can be employed, the combined thickness of two or more barrier layers dictating the shift of the TMR characteristic curve 26.

It is thus possible to provide an SDT cell of improved performance over known SDT cells and hence exhibiting superior access times. Further, improved tolerance to CMOS mismatch is also provided due to the SDT cell exhibiting an improved Signal-to-Noise Ration (SNR) and improved margin with respect to so-called "marginal" bits (bits having significantly lower or higher resistance than an average resistance value corresponding to a bit). In the context of MRAM cells and devices, it is thus possible to permit a bias voltage to be employed, thereby enabling a fuller use of a range of the TMR characteristic curve.

The invention claimed is:

1. A method of forming a Spin-Dependent Tunnelling cell comprising:
   forming a first layer of ferromagnetic material;
   forming a hybrid barrier comprising formation of a first barrier layer adjacent the first ferromagnetic layer and a second barrier layer adjacent the first barrier layer, wherein the first barrier layer has a first thickness ($t_1$), and the second barrier layer has a second thickness ($t_2$) different from the first thickness; and
   forming a second layer of ferromagnetic material adjacent the second barrier layer wherein the first and second barrier layers being formed to a combined thicknesses so that a Tunnelling Magnetoresistance versus voltage characteristic of the cell has, when in use, a maximum substantially at a non-zero bias voltage.

2. A method as claimed in claim 1, wherein the non-zero voltage associated with the maximum of the Tunnelling Magnetoresistance versus voltage characteristic corresponds substantially to the combined thickness of the barrier layers.

3. A method as claimed in claim 1, wherein the first layer of ferromagnetic material is a different material to the second layer of ferromagnetic material.

4. A method as claimed in claim 1, wherein the first barrier layer is formed from $Al_xO_y$.

5. A method as claimed in claim 1, wherein the second barrier layer is formed from MgO.

6. A method as claimed in claim 1, wherein the second barrier layer is formed from $Al_xO_y$.

7. A method as claimed in claim 1, wherein $t_1/(t_1+t_2)$ is in a range of about 0.1 to about 0.9.

8. A method as claimed in claim 1, wherein the first barrier layer is formed from MgO.

9. A method of forming a Magnetic Random Access Memory cell comprising the method of forming a Spin Dependent Tunnelling cell as claimed in claim 1.

10. A method of forming a Random Access Memory device comprising the method of forming a Spin Dependent Tunnelling cell as claimed in claim 1.

11. A method as claimed in claim 1, wherein the first barrier layer provides a first quantum barrier and the second barrier layer provides a second quantum barrier, wherein the non-zero bias voltage depends upon a potential difference in height between the first and second quantum barriers.

12. A method as claimed in claim 11, wherein an absolute value of the potential difference in height between the first and second quantum barriers is between about 0 eV and about 10 eV.

13. A Spin-Dependent Tunnelling cell, the cell comprising:
   a first layer of ferromagnetic material;
   a hybrid barrier comprising a first barrier layer disposed adjacent the first ferromagnetic layer and a second barrier layer disposed adjacent the first barrier layer, wherein the first barrier layer has a first thickness ($t_1$), and the second barrier layer has a second thickness ($t_2$) different from the first thickness; and
   a second layer of ferromagnetic material disposed adjacent the second barrier layer wherein the first and second barrier layers have a combined thicknesses so that a Tunnelling Magnetoresistance versus voltage characteristic of the cell has, when in use, a maximum substantially at a non-zero bias voltage.

14. A memory device comprising an array of Spin-Dependent Tunnelling cells as claimed in claim 13.

15. A cell as claimed in claim 13, wherein the first layer of ferromagnetic material is a different material to the second layer of ferromagnetic material.

16. A cell as claimed in claim 13, wherein the first barrier layer is formed from $Al_xO_y$.

17. A cell as claimed in claim 13, wherein the second barrier layer is formed from MgO.

18. A cell as claimed in claim 13, wherein $t_1/(t_1+t_2)$ is in a range of about 0.1 to about 0.9.

19. A cell as claimed in claim 13, wherein the first barrier layer provides a first quantum barrier and the second barrier layer provides a second quantum barrier, wherein the non-zero bias voltage depends upon a potential difference in height between the first and second quantum barriers.

20. A cell as claimed in claim 19, wherein an absolute value of the potential difference in height between the first and second quantum barriers is between about 0 eV and about 10 eV.

* * * * *